(12) United States Patent
Ikisawa et al.

(10) Patent No.: US 9,214,253 B2
(45) Date of Patent: Dec. 15, 2015

(54) SINTERED COMPACT OF INDIUM OXIDE SYSTEM, AND TRANSPARENT CONDUCTIVE FILM OF INDIUM OXIDE SYSTEM

(75) Inventors: Masakatsu Ikisawa, Ibaraki (JP); Hideo Takami, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 635 days.

(21) Appl. No.: 13/499,712

(22) PCT Filed: Oct. 13, 2010

(86) PCT No.: PCT/JP2010/067926
§ 371 (c)(1),
(2), (4) Date: Apr. 2, 2012

(87) PCT Pub. No.: WO2011/052375
PCT Pub. Date: May 5, 2011

(65) Prior Publication Data
US 2012/0199796 A1    Aug. 9, 2012

(30) Foreign Application Priority Data

Oct. 26, 2009 (JP) .................................. 2009-245293

(51) Int. Cl.
| H01B 1/08 | (2006.01) |
| C03C 17/245 | (2006.01) |
| C04B 35/01 | (2006.01) |
| C04B 35/626 | (2006.01) |
| C23C 14/08 | (2006.01) |
| C23C 14/34 | (2006.01) |
| C23C 30/00 | (2006.01) |

(52) U.S. Cl.
CPC ............... *H01B 1/08* (2013.01); *C03C 17/245* (2013.01); *C04B 35/01* (2013.01); *C04B 35/6261* (2013.01); *C04B 35/62635* (2013.01); *C04B 35/62695* (2013.01); *C23C 14/086* (2013.01); *C23C 14/3414* (2013.01); *C23C 30/00* (2013.01); *C04B 2235/3251* (2013.01); *C04B 2235/3286* (2013.01); *C04B 2235/3293* (2013.01); *C04B 2235/5409* (2013.01); *C04B 2235/5436* (2013.01); *C04B 2235/5445* (2013.01); *C04B 2235/604* (2013.01); *C04B 2235/6567* (2013.01); *C04B 2235/77* (2013.01); *C04B 2235/9653* (2013.01)

(58) Field of Classification Search
CPC .......... C04B 35/00; C23C 14/32; H01B 1/08; H01B 5/12; H01B 1/02
USPC ....................................... 252/512
See application file for complete search history.

(56) References Cited

U.S. PATENT DOCUMENTS

| 5,045,235 | A | 9/1991 | Ohara et al. |
| 6,528,442 | B1 | 3/2003 | Kuwano et al. |
| 6,929,772 | B2 | 8/2005 | Yanai et al. |
| 7,008,519 | B2 * | 3/2006 | Takahashi et al. ........ 204/192.23 |
| 7,504,351 | B2 | 3/2009 | Kurihara |
| 7,612,850 | B2 | 11/2009 | Inoue et al. |
| 7,897,067 | B2 * | 3/2011 | Inoue ...................... 252/519.51 |
| 8,252,206 | B2 | 8/2012 | Ikisawa et al. |
| 8,277,694 | B2 | 10/2012 | Ikisawa et al. |
| 8,728,358 | B2 | 5/2014 | Ikisawa et al. |
| 8,771,557 | B2 | 7/2014 | Takami et al. |
| 2004/0180217 | A1 | 9/2004 | Inoue et al. |
| 2007/0117237 | A1 * | 5/2007 | Inoue .............................. 438/30 |
| 2007/0170434 | A1 * | 7/2007 | Inoue et al. ..................... 257/72 |
| 2008/0308774 | A1 | 12/2008 | Inoue et al. |
| 2010/0078070 | A1 * | 4/2010 | Hosoya et al. ................ 136/256 |
| 2010/0140570 | A1 | 6/2010 | Ikisawa et al. |
| 2010/0189636 | A1 | 7/2010 | Ikisawa et al. |
| 2012/0024192 | A1 | 2/2012 | Takami et al. |
| 2012/0043509 | A1 | 2/2012 | Takami et al. |
| 2014/0264197 | A1 | 9/2014 | Takami et al. |

FOREIGN PATENT DOCUMENTS

| EP | 1380857 A1 | 1/2004 |
| JP | 03-015107 A | 1/1991 |
| JP | 10269843 A * | 10/1998 |
| JP | 2002-274848 A | 9/2002 |
| JP | 2005-314734 A | 11/2005 |
| JP | 2006-022373 A | 1/2006 |

OTHER PUBLICATIONS

R.K. Gupta et al., "Effect of Substrate Temperature on Opto-Electrical Properties of Nb-doped In2O3 Thin Films", Journal of Crystal Growth, vol. 310, pp. 4336-4339, Jul. 2008.

(Continued)

*Primary Examiner* — Mark Kopec
*Assistant Examiner* — Danny N Kang
(74) *Attorney, Agent, or Firm* — Howson & Howson LLP

(57) ABSTRACT

A sintered indium oxide comprising niobium as an additive, wherein the ratio of the number of niobium atoms relative to the total number of atoms of all metal elements contained in the sintered compact is within a range of 1 to 4%, the relative density is 98% or higher, and the bulk resistance is 0.9 mΩ·cm or less. Provided are a sintered compact of indium oxide system and a transparent conductive film of indium oxide system, which have characteristics of high transmittance in the short wavelength and long wavelength ranges since the carrier concentration is not too high even though the resistivity thereof is low.

6 Claims, No Drawings

(56) References Cited

OTHER PUBLICATIONS

R.K. Gupta et al., "Effect of Oxygen Partial Pressure on Properties of Nb-doped In2O3 Thin Films", Materials Chemistry and Physics, vol. 112, pp. 136-139, May 2008.

A.E. Delahoy et al., "Transparent and Semitransparent Conducting Film Deposition by Reactive-Environment, Hollow Cathode Sputtering", Journal of Vacuum Science and Technology, Part A, AVS/AIP, vol. 23, No. 4, pp. 1215-1220, Jun. 2005.

* cited by examiner

SINTERED COMPACT OF INDIUM OXIDE SYSTEM, AND TRANSPARENT CONDUCTIVE FILM OF INDIUM OXIDE SYSTEM

BACKGROUND

The present invention relates to an sintered compact of indium oxide system, and an transparent conductive film of indium oxide system.

As for a transparent conductive film, indium oxide doped with tin (hereinafter referred to as "ITO") is being widely used as an electrode material of FPD (flat-panel displays) and the like due to its superior characteristics including low resistivity and high transmittance.

There are various uses of a transparent conductor in addition to use in a flat-panel display, but among such uses, demands as a material for window-layer electrode on the optical incidence plane side of solar cells have increased in recent years.

Since the spectral sensitivity of solar cells is up to approximately 1200 nm with crystal silicon type solar cells and up to approximately 1300 nm with CIGS (Cu—In—Ga—Se-based) type solar cells, high transmittance is demanded even up to the foregoing long wavelength range. Moreover, with amorphous silicon solar cells, since the spectral sensitivity is in a short wavelength up to approximately 300 nm, transmittance of the transparent conductive film is demanded to be high also up to the short wavelength range.

Nevertheless, when ITO is used as the material for window-layer electrode of solar cells, ITO is advantageous since it has low resistivity, but on the other hand, there is a problem in that the conversion efficiency of the solar cells will deteriorate, since its transmittance in a long wavelength range more than the vicinity of a wavelength of 1200 nm is inferior because of its high carrier concentration and the long wavelength range of solar light cannot be utilized effectively.

As a transparent conductive film other than ITO, known is a type in which indium oxide is doped with zinc oxide. Although indium oxide doped with zinc oxide enables to obtain a relatively favorable film on a non-heated substrate, since it contains zinc, there are problems in that its moisture resistance is inferior, its long-term stability is insufficient, and its short wavelength transmittance is low.

Under the foregoing circumstances, the present invention focused on indium oxide doped with niobium (hereinafter referred to as "INbO") as a potential material having high transmittance and low resistivity in both the short wavelength and long wavelength ranges.

The following documents have previously reported on INbO.

Patent Document 1 describes that a low-resistance transparent conductive film can be obtained by adding niobium or the like to $In_2O_3$. Nevertheless, it is important for a sintered compact made from these materials to possess characteristics that are required as a sputtering target, but there is no description regarding the target characteristics.

Moreover, Patent Document 1 briefly describes the electrical and optical characteristics of the film that is obtained through sputter deposition. Nevertheless, Patent Document 1 fails to disclose the carrier concentration, and the transmittance at the short wavelength and long wavelength ranges other than a wavelength of 550 nm.

In addition, the deposition condition where the substrate temperature is 300° C. is unacceptable level of high temperature as a condition of a normal production process of transparent conductive films for solar cells. Patent Document 1 additionally shows that a mixture gas, in which a ratio of oxygen to argon is 1:9 and which is of a high oxygen concentration considerably different from the standard condition, is used as a sputter gas.

Patent Document 2 describes $In_2O_3$ doped with niobium. Nevertheless, the specification describes that, when $In_2O_3$ is doped with niobium, it is extremely effective to concurrently use a tin component in order to achieve low resistance of the obtained product. Moreover, the Examples do not illustrate any instance where niobium is independently added to $In_2O_3$, and tin is always added in cases where niobium is added; and further describes that tin should be added at a high concentration of at least 3.5 wt % or higher.

Accordingly, Patent Document 2 fails to specifically describe independently adding niobium to $In_2O_3$, and, even in cases of concurrently adding tin, the addition of tin is not in trace amounts.

Moreover, with Patent Document 2, the sputter gas is pure argon and oxygen is not added. Thus, it could be assumed that a part of the oxides configuring the film will be reduced and tend to become a metal component, and it causes the transmittance to deteriorate. Nevertheless, the only description regarding the transmittance of the obtained film is regarding the result at a wavelength of 550 nm, and the transmittance in the short wavelength and long wavelength ranges is unknown. Moreover, the substrate temperature is also a high temperature at 350° C.

Patent Document 3 describes conductive oxide particles having a crystal structure of indium oxide consisting of indium atoms, antimony atoms and oxygen atoms, or to which zinc atoms are added; and further describes about use of niobium in substitute for antimony. The molar ratio of Nb/In is described as being within a range of 0.01 to 0.10.

Nevertheless, Patent Document 3 relates to a deposition method based on particulate coating, and this technology is unrelated to the sintered compact for use as a target of the present invention described later and the transparent conductive film obtained by sputter deposition using such sintered compact.

Furthermore, there is no specific example of conductive oxide particles in which niobium is independently added to indium, but in Table 2 of Patent Document 3, there are Examples in which antimony and niobium are simultaneously added. Nevertheless, with the Examples described in Table 2, the lowest specific resistance value is 3.1 Ωcm. There is no choice but to say that this value is extremely insufficient in order to achieve low specific resistance. This is considered to be a result of the additive amount of niobium, which is used in substitute for antimony, being small.

It is obvious that Patent Document 3 is different from the present invention described later. Only for reference, it has been described herein.

Patent Document 4 describes that a high-density sintered compact is produced by using indium oxide powder as the main component, adding tungsten oxide powder thereto and sintering the mixed powder; and further describes that silicon, titanium, zinc, gallium, germanium, niobium, molybdenum, ruthenium, or tin can be used in substitute for tungsten oxide. Nevertheless, most of the Examples are preoccupied with the addition of tungsten oxide, and there is only one specific example of a substitute element.

This example does not clearly describe about the additive amount in the case of single additive, and the additive amount in the case of plural additives. Moreover, both cases aim to increase the density, and the specific resistance is completely unknown. The listed substitute elements lack materiality, and it cannot be said that Patent Document 4 is technology worth disclosure as a target comprising substitute elements for a transparent conductor.

Non-Patent Document 1 briefly describes the substrate temperature upon depositing $In_2O_3$ doped with niobium by the PLD (pulsed laser deposition) method and the electrical and optical characteristics of the film. Nevertheless, it is described that, when the substrate temperature is low, the resistivity is extremely high and the carrier concentration also increases. Moreover, when the substrate temperature is 200° C. or higher, the carrier concentration is an extremely high value in the $10^{21}$ cm$^{-3}$ range, and it is assumed that the transmittance in the long wavelength range is extremely low. However, only the measurement results up to a wavelength of 1100 nm are described. Moreover, it is described that the transmittance is low in a short wavelength, and becomes even lower when the substrate temperature is low.

Non-Patent Document 2 briefly describes the oxygen concentration upon depositing $In_2O_3$ doped with niobium by the PLD method and the electrical and optical characteristics of the film. Nevertheless, all results are based on the condition where the substrate temperature is extremely high at 400° C., and, since the carrier concentration is also high when the resistivity is low, it is assumed that the transmittance in the long wavelength range will be low. However, only the measurement results up to a wavelength of 900 nm are described.

[Patent Document 1] Japanese Laid-Open Patent Publication No. H2-309511
[Patent Document 2] Japanese Laid-Open Patent Publication No. H3-15107
[Patent Document 3] Japanese Laid-Open Patent Publication No. 2002-274848
[Patent Document 4] Japanese Laid-Open Patent Publication No. 2006-22373
[Non-Patent Document 1] Journal of Crystal Growth 310 (2008) 4336-4339
[Non-Patent Document 2] Materials Chemistry and Physics 112 (2008) 136-139

SUMMARY OF INVENTION

Technical Problem

An object of this invention is to provide an sintered compact of indium oxide system, and an transparent conductive film of indium oxide system; specifically, a transparent conductive film obtained through deposition on the non-heated substrate, which have characteristics of high transmittance in the short wavelength and long wavelength ranges since the carrier concentration is not too high even though the resistivity thereof is low.

Solution to Problem

As a result of intense study, the present inventors discovered that low resistivity and high transmittance can be achieved by adding an appropriate amount of niobium to indium oxide, and thereby completed the present invention.

According to the present invention, it is possible to provide the following sintered oxide and transparent conductive oxide film.

1. A sintered indium oxide, wherein the sintered indium oxide comprises niobium as an additive, the ratio of the number of niobium atoms relative to the total number of atoms of all metal elements contained in the sintered compact is within a range of 1 to 4%, the relative density is 98% or higher, and the bulk resistance is 0.9 mΩ·cm or less.

2. The sintered indium oxide according to 1 above, wherein the sintered indium oxide further comprises tin besides the said additive, the ratio of the number of tin atoms relative to the total number of atoms of all metal elements contained in the sintered compact is within a range of 0.01 to 0.2%, the relative density is 99.5% or higher, and the bulk resistance is 0.9 mΩ·cm or less.

3. A transparent conductive indium-oxide film, wherein the transparent conductive indium-oxide film comprises niobium as an additive, the ratio of the number of niobium atoms relative to the total number of atoms of all metal elements contained in the transparent conductive film is within a range of 1 to 4%, the resistivity is $8\times10^{-4}$ Ω·cm or less, the carrier concentration is $6\times10^{20}$ cm$^{-3}$ or less, the transmittance at a wavelength of 1200 nm is 87% or higher, and the transmittance at a wavelength of 400 nm is 70% or higher.

4. The transparent conductive indium-oxide film according to 3 above, wherein the transparent conductive indium-oxide film further comprises tin besides the said additive, the ratio of the number of tin atoms relative to the total number of atoms of all metal elements contained in the transparent conductive film is within a range of 0.01 to 0.2%, the resistivity is $8\times10^{-4}$ Ω·cm or less, the carrier concentration is $6\times10^{20}$ cm$^{-3}$ or less, the transmittance at a wavelength of 1200 nm is 87% or higher, and the transmittance at a wavelength of 400 nm is 70% or higher.

According to the present invention, it is possible to provide a transparent conductive film having low resistivity, low carrier concentration, and high transmittance up to a long wavelength range. Therefore, when such transparent conductive film is used as a window layer of solar cells, it is possible to yield a superior effect that the long wavelength range of solar light can be utilized effectively and the conversion efficiency of solar cells can be increased.

DETAILED DESCRIPTION

In the present invention, the content of the additive element in the sintered oxide or the transparent conductive film is stipulated based on the ratio of the number of atoms of the additive element relative to the total number of atoms of all metal elements in the sintered compact or the transparent conductive film.

For example, when a sintered oxide consisting of indium-oxygen is doped with niobium, all metal elements contained in the sintered compact will be indium and niobium. Upon representing the number of indium atoms as In and representing the number of niobium atoms as Nb; {Nb/(In+Nb)×100} will be the ratio of the number of niobium atoms relative to the total number of atoms of all metal elements contained in the sintered compact.

Similarly, when a sintered oxide consisting of indium-oxygen is doped with tin in addition to niobium, all metal elements contained in the sintered compact will be indium, niobium and tin. Upon representing the number of indium atoms as In, representing the number of niobium atoms as Nb, and representing the number of tin atoms as Sn; {Sn/(In+Nb+Sn)×100} will be the ratio of the number of tin atoms relative to the total number of atoms of all metal elements contained in the sintered compact.

In the present invention, it is preferable that the ratio of the number of niobium atoms contained in the sintered oxide or the transparent conductive oxide film relative to the total number of atoms of all metal elements contained in the sintered compact or the transparent conductive film is within a range of 1 to 4%.

If the ratio of the number of niobium atoms is less than 1%, a sintered compact contains too little dopant, which emits electrons and increases the carrier concentration, and the carrier concentration will be low. A film produced by such sintered compact will not have a low resistivity. Meanwhile, if the ratio of the number of niobium atoms exceeds 4%, the electron emission from the added niobium is not performed sufficiently, neutral impurity scattering will increase, mobility will deteriorate, and the film will have high resistivity.

In the present invention, it is preferable that the ratio of the number of tin atoms contained in the sintered oxide or the transparent conductive oxide film is within a range of 0.01 to 0.2%.

If the ratio of the number of tin atoms is less than 0.01%, it is not possible to sufficiently increase the density of the sintered indium oxide. Meanwhile, if the tin atomic concentration exceeds 0.2%, it is not possible to further increase the sintered density, and, since the carrier concentration will increase, the transmittance in a long wavelength range will deteriorate.

In the present invention, the relative density of the sintered compact is 98% or higher when tin is not added, and 99.5% or higher when tin is added at a predetermined concentration. Moreover, the bulk resistance is 0.9 mΩ·cm or less, preferably 0.5 mΩ·cm or less.

Accordingly, by causing the sintered compact to have high relative density and low bulk resistance, it is possible to yield the effects of preventing the abnormal discharge during sputtering and inhibiting the generation of nodules and arcing when performing sputtering for a long time.

The resistivity of the transparent conductive film obtained in the present invention is $8 \times 10^{-4}$ mΩ·cm or less, and the carrier concentration is $6 \times 10^{20}$ cm$^{-3}$.

Accordingly, the low-resistivity film obtained as described above is effective as an electrode for use in solar cells, and, by keeping the carrier concentration to be a constant value or less, the transmittance in a long wavelength range can be maintained high.

In addition, since niobium of a predetermined concentration is used as the dopant for the transparent conductive film obtained in the present invention, it is possible to achieve high transmittance also in a short wavelength range in comparison to a transparent conductive film of indium oxide doped with zinc oxide.

The sintered indium oxide and the transparent conductive film of the present invention can be prepared based on, for example, the following method.

Foremost, indium oxide ($In_2O_3$), niobium oxide ($Nb_2O_5$), and, as needed, tin oxide ($SnO_2$) are used as the raw powders.

Preferably, these raw powders have a specific surface area of roughly 10 m$^2$/g. This is because if the specific surface area is small, then the grain size becomes large, and the density of the sintered compact cannot be increased sufficiently.

Subsequently, these raw powders are weighed to achieve a predetermined concentration ratio, and then mixed. If the mixing is insufficient, the respective components become segregated in the sintered compact, and a high resistivity range and a low resistivity range will coexist. In particular, since arcing (abnormal discharge) caused by the charging during the sputter deposition will occur in the high resistivity range, sufficient mixing is required for overcoming this problem.

For example, the raw powders can be mixed using a super mixer in the atmosphere at a rotation speed of 2000 to 4000 rpm and a rotation time of 3 to 5 minutes. Since the raw powders are oxides, the atmosphere gas is not required to prevent the oxidation of the raw materials. Therefore, it is not necessary to use expensive gas such as argon, and there is no particular problem even if the mixing is performed in the atmosphere.

As a mixing method, it is also possible to employ a method of using a ball mill and mixing the raw powders for a long time. Moreover, there is no particular problem in using other methods so as long as they are able to achieve the object of uniformly mixing the raw materials.

Subsequently, pulverization is performed. Here, a calcination step may be introduced before pulverization, and calcination is able to increase the sintered density.

Pulverization is performed for uniformly dispersing the respective compositions of the raw powders within the sintered compact. If pulverization is not sufficiently performed, raw powders having a large grain size will remain, the composition will vary with location, and this will cause abnormal discharge during the sputter deposition.

Specifically, calcined powder can be placed in an attritor together with zirconia beads and pulverized at a rotation speed of 200 to 400 rpm and a rotation time of 2 to 4 hours. Pulverization is desirably performed until the raw powder becomes to have an average grain size (D50) of 1 μm or less, and preferably 0.6 μm or less.

Subsequently, granulation is performed. It is thereby possible to improve the fluidity of the raw powders, and improve the filled state during press molding. The pulverized raw materials are granulated after adjusting the moisture content to become a slurry having a solid content of 40 to 60%. Here, preferably, the inlet temperature is set to 180 to 220° C. and the outlet temperature is set to 110 to 130° C.

Subsequently, press molding is performed. The granulated powder can be subject to press molding under the following conditions; namely, bearing of 400 to 800 kgf/cm$^2$ and retention time of 1 to 3 minutes. If the bearing is less than 400 kgf/cm$^2$, it is not possible to obtain a high-density compact. Meanwhile, even if the bearing exceeds 800 kgf/cm$^2$, further high density cannot be achieved, and this is not preferable in terms of productivity since it requires wasteful energy and cost.

Subsequently, molding is performed with cold isostatic pressing (CIP) device under the following conditions; namely, bearing of 1700 to 1900 kgf/cm$^2$ and retention time of 1 to 3 minutes, and the product is thereafter sintered with an electric furnace in an oxygen atmosphere at 1400 to 1600° C. by being retained for 10 to 30 hours. It is thereby possible to prepare a sintered oxide.

With respect to the density of the sintered compact, the relative density can be obtained by measuring the density with the Archimedian method and dividing it by the theoretical density. Moreover, the bulk resistance of the sintered compact can be measured with the four-terminal method.

Subsequently, the obtained sintered compact can be processed into a sputtering target of a predetermined shape via grinding or the like. In addition, a transparent conductive film can be obtained by performing sputter deposition to the product in an argon atmosphere to which trace amounts of oxygen are added, under a pressure of 0.5 Pa, and without heating the glass substrate.

The resistivity and mobility of the film can be obtained via Hall measurement. Moreover, the transmittance can be measured with a spectral transmittance meter.

EXAMPLES

Example 1

Indium oxide ($In_2O_3$) raw powder and niobium oxide ($Nb_2O_5$) raw powder having an average grain size of approximately 2.0 μm were weighed so that the ratio of the number of niobium atoms relative to the total number of atoms of all metal elements becomes 1%, and thereafter mixed with a super mixer in the atmosphere at a rotation speed of 3000 rpm and a rotation time of 3 minutes.

Subsequently, the mixed powder was placed in an attritor together with zirconia beads and pulverized at a rotation speed of 300 rpm and a rotation time of 3 hours in order to achieve an average grain size (D50) of 0.8 μm. The moisture content was adjusted so that the pulverized raw material became a slurry having a solid content of 50%, and granulation was performed by setting the inlet temperature to 200° C. and the outlet temperature to 120° C.

In addition, the granulated powder was subject to press molding under the following conditions; namely, bearing of 600 kgf/cm² and retention time of 1 minute. It was thereafter molded with cold isostatic pressing (CIP) device under the following conditions; namely, bearing of 1800 kgf/cm² and retention time of 1 minute. Subsequently, this compact was sintered with an electric furnace in an oxygen atmosphere at 1550° C. by being retained for 20 hours. The relative density of the obtained sintered compact was 98.7%, and the bulk resistance was 0.47 mΩ·cm.

The sintered compact was processed into a sputtering target by being ground into a disk shape having a diameter of 6 inches and a thickness of 6 mm. The obtained target was set in a sputter device, and deposition was performed via sputtering with this target on a non-heated glass substrate in an argon atmosphere to which 1% of oxygen was added, under a pressure of 0.5 Pa, and at a sputter power of 1 kW to obtain a transparent conductive film.

Upon subjecting the film to Hall measurement, the resistivity was 0.79 mΩ·cm, the carrier concentration was $4.0 \times 10^{20}$ cm$^{-3}$, and the transmittance of the film was 87.9% at a wavelength of 1200 nm and 70.1% at a wavelength of 400 nm. The representative conditions and effects of Example 1 are collectively shown in Table 1.

Examples 2 to 4

Comparative Examples 1 and 2

The production method of the sintered compact and the production method of the transparent conductive film were the same as Example 1, and only the ratio of the atomic concentration (number of atoms) of niobium was changed. In other words, the niobium atomic concentration was set to 2.0% in Example 2, the niobium atomic concentration was set to 3.0% in Example 3, and the niobium atomic concentration was set to 4.0% in Example 4. Moreover, the niobium atomic concentration was set to 0.5% in Comparative Example 1, and the niobium atomic concentration was set to 5.0% in Comparative Example 2.

The characteristics of the obtained sintered compact and film are shown in Table 1. Based on these results, it can be seen that, since the resistivity increases when the ratio of the number of niobium atoms is outside the range of 1 to 4%, this is not a favorable quality of a transparent conductive film. Moreover, even in cases where tin is not added, the relative density was relatively high at 98.7% or higher.

Comparative Example 3

The production process of the sintered compact was the same as Example 1 other than setting the sintering temperature for the sintered compact at 1350° C. The relative density of the obtained sintered compact was low at 97.3%. Moreover, the bulk resistance was high at 1.2 mΩ·cm. Although these results are not shown in Table 1, it was confirmed that an appropriate sintering temperature is required in order to lower the bulk resistance value.

Examples 5 to 9

Comparative Examples 4 to 6

The production method of the sintered compact and the production method of the transparent conductive film were the same as Example 1, and the ratio of the number of niobium atoms was set to 2.0%, and only the ratio of tin atomic concentration was changed. In other words, the tin atomic concentration was set to 0.01% in Example 5, the tin atomic concentration was set to 0.05% in Example 6, the tin atomic concentration was set to 0.10% in Example 7, the tin atomic concentration was set to 0.15% in Example 8, and the tin atomic concentration was set to 0.20% in Example 9. Moreover, the tin atomic concentration was set to 0.005% in Comparative Example 4, the tin atomic concentration was set to 0.50% in Comparative Example 5, and the tin atomic concen-

TABLE 1

| Examples | Nb Atomic Concentration (%) | Sn Atomic Concentration (%) | Relative Density (%) | Bulk Resistance (mΩcm) | Resistivity (mΩcm) | Carrier Concentration (cm$^{-3}$) | Transmittance (at 1200 nm) (%) | Transmittance (at 400 nm) (%) |
|---|---|---|---|---|---|---|---|---|
| Example 1 | 1.0 | 0.00 | 98.7 | 0.47 | 0.79 | 4.0 | 87.9 | 70.1 |
| Example 2 | 2.0 | 0.00 | 99.2 | 0.45 | 0.49 | 5.0 | 90.6 | 73.6 |
| Example 3 | 3.0 | 0.00 | 99.1 | 0.46 | 0.54 | 4.1 | 91.0 | 73.2 |
| Example 4 | 4.0 | 0.00 | 99.3 | 0.48 | 0.69 | 3.8 | 90.0 | 72.8 |
| Comparative Example 1 | 0.5 | 0.00 | 98.3 | 0.53 | 1.20 | 3.1 | 88.3 | 68.7 |
| Comparative Example 2 | 5.0 | 0.00 | 99.1 | 0.49 | 1.10 | 3.5 | 89.1 | 69.3 |
| Example 5 | 2.0 | 0.01 | 99.7 | 0.45 | 0.48 | 4.9 | 90.6 | 73.4 |
| Example 6 | 2.0 | 0.05 | 99.8 | 0.43 | 0.49 | 5.1 | 90.3 | 73.6 |
| Example 7 | 2.0 | 0.10 | 99.8 | 0.44 | 0.47 | 5.0 | 90.5 | 73.3 |
| Example 8 | 2.0 | 0.15 | 99.9 | 0.44 | 0.48 | 4.9 | 90.7 | 73.8 |
| Example 9 | 2.0 | 0.20 | 99.8 | 0.43 | 0.47 | 5.0 | 90.4 | 73.5 |
| Comparative Example 4 | 2.0 | 0.005 | 99.1 | 0.44 | 0.49 | 5.0 | 90.5 | 73.4 |
| Comparative Example 5 | 2.0 | 0.50 | 99.9 | 0.43 | 0.48 | 5.8 | 86.7 | 75.2 |
| Comparative Example 6 | 2.0 | 1.00 | 99.8 | 0.44 | 0.47 | 6.1 | 85.3 | 75.0 | tration was set to 1.00% in Comparative Example 6. The characteristics of the obtained sintered compact and film are similarly shown in Table 1.

Based on these results, even when the tin concentration is 0% as in Example 1, the relative density is relatively high at 98.7%, but when tin is additionally added at an appropriate concentration or more, the relative density became even higher at 99.7% or higher.

Meanwhile, when the ratio of the number of tin atoms is 0.5% or higher, improvement in the relative density becomes saturated, the carrier concentration of the obtained film increases, and the transmittance at a wavelength of 1200 nm deteriorates.

Comparative Example 7

Indium oxide doped with zinc oxide was used as the sintered compact material, wherein indium oxide ($In_2O_3$) raw powder and zinc oxide (ZnO) raw powder, which have an average grain size of approximately 2.0 μm, were weighed so that the ratio of the number of zinc atoms relative to the total number of zinc atoms and indium atoms becomes 10%. The subsequent production method of the sintered compact and the production method of the transparent conductive film were the same as Example 1.

Although the results are not shown in Table 1, the relative density of the obtained sintered compact was 98.0%, and the bulk resistance was 0.48 mΩ·cm. The resistivity of the film was 0.48 mΩ·cm, the carrier concentration was $6.1 \times 10^{20}$ $cm^{-3}$, and the transmittance of the film was 83.9% at a wavelength of 1200 nm and 61.2% at a wavelength of 400 nm. Accordingly, when the composition of the sintered compact is different as described above, the carrier concentration becomes $6.1 \times 10^{20}$ $cm^{-3}$ and deviated from the conditions of the present invention, and the intended characteristics could not be obtained.

The sintered indium oxide of the present invention that is doped with trace amounts of niobium is of high density, and therefore if it is used as a sputtering target, it is possible to inhibit the generation of nodules on its surface and prevent the occurrence of abnormal discharge during sputtering.

Moreover, the sintered indium oxide of the present invention has low bulk resistivity, and therefore, enables to reduce the resistivity of the film that is formed via sputtering, and it is effective in forming a transparent conductive film.

In addition, the transparent conductive indium-oxide film has low resistivity and high transmittance across a broad range from a short effective as a transparent conductive film for use in solar cells.

The invention claimed is:

1. An indium oxide sintered compact, wherein the indium oxide sintered compact contains niobium as an additive, the ratio of the number of niobium atoms relative to the total number of atoms of all metal elements contained in the sintered compact is within a range of 1 to 4%, the relative density is 98% or higher, and the bulk resistance is 0.5 mΩ·cm or less.

2. An indium oxide sintered compact, wherein the indium oxide sintered compact contains niobium as an additive, a ratio of the number of niobium atoms relative to a total number of atoms of all metal elements contained in the sintered compact is within a range of 1 to 4%, and wherein the indium oxide sintered compact further contains tin and the metal elements in the sintered indium oxide consist of indium, niobium and tin, the ratio of the number of tin atoms relative to the total number of atoms of all metal elements contained in the sintered compact is within a range of 0.01 to 0.2%, the relative density is 99.5% or higher, and the bulk resistance is 0.5 mΩ·cm or less.

3. A transparent conductive indium-oxide film, wherein the transparent conductive indium-oxide film contains niobium as an additive, the ratio of the number of niobium atoms relative to the total number of atoms of all metal elements contained in the transparent conductive film is within a range of 1 to 4%, the resistivity is $8 \times 10^{-4}$ Ω·cm or less, the carrier concentration is $6 \times 10^{20}$ $cm^{-3}$ or less, the transmittance at a wavelength of 1200 nm is 87% or higher, and the transmittance at a wavelength of 400 nm is 70% or higher.

4. The transparent conductive indium-oxide film according to claim 3, wherein the transparent conductive indium-oxide film further contains tin and the metal elements in the transparent conductive indium-oxide film consist of indium, niobium and tin, the ratio of the number of tin atoms relative to the total number of atoms of all metal elements contained in the transparent conductive film is within a range of 0.01 to 0.2%, the resistivity is $8 \times 10^{-4}$ Ω·cm or less, the carrier concentration is $6 \times 10^{20}$ $cm^{-3}$ or less, the transmittance at a wavelength of 1200 nm is 87% or higher, and the transmittance at a wavelength of 400 nm is 70% or higher.

5. The transparent conductive indium oxide film according to claim 3, wherein the metal elements in the transparent conductive indium-oxide film consist of indium and niobium.

6. The indium oxide sintered compact according to claim 1, wherein the metal elements in the indium oxide sintered compact consist of indium and niobium.

* * * * *

UNITED STATES PATENT AND TRADEMARK OFFICE
CERTIFICATE OF CORRECTION

PATENT NO.      : 9,214,253 B2
APPLICATION NO. : 13/499712
DATED           : December 15, 2015
INVENTOR(S)     : Ikisawa et al.

It is certified that error appears in the above-identified patent and that said Letters Patent is hereby corrected as shown below:

In the Specification
Column 9, line 47, "short effective" should read "short wavelength range to a long wavelength range, and therefore, it is extremely effective".

Signed and Sealed this
Twelfth Day of July, 2016

Michelle K. Lee
*Director of the United States Patent and Trademark Office*